(12) United States Patent
Chang et al.

(10) Patent No.: US 12,543,368 B2
(45) Date of Patent: Feb. 3, 2026

(54) STRUCTURE OF SEMICONDUCTOR DEVICE STRUCTURE HAVING FINS

(71) Applicant: Parabellum Strategic Opportunities Fund LLC, Wilmington, DE (US)

(72) Inventors: Che-Cheng Chang, New Taipei (TW); Jui-Ping Chuang, Hsinchu (TW); Chen-Hsiang Lu, Hsinchu (TW); Yu-Cheng Liu, Zhubei (TW); Wei-Ting Chen, Tainan (TW)

(73) Assignee: Parabellum Strategic Opportunities Fund LLC, Austin, TX (US)

(*) Notice: Subject to any disclaimer, the term of this patent is extended or adjusted under 35 U.S.C. 154(b) by 466 days.

(21) Appl. No.: 18/313,190

(22) Filed: May 5, 2023

(65) Prior Publication Data
US 2023/0275142 A1   Aug. 31, 2023

Related U.S. Application Data

(60) Continuation of application No. 16/902,190, filed on Jun. 15, 2020, now Pat. No. 11,682,716, which is a
(Continued)

(51) Int. Cl.
*H01L 29/66* (2006.01)
*H01L 21/311* (2006.01)
(Continued)

(52) U.S. Cl.
CPC .... *H01L 27/0922* (2013.01); *H01L 21/31111* (2013.01); *H01L 21/76224* (2013.01);
(Continued)

(58) Field of Classification Search
CPC .......... H01L 21/823431; H01L 21/845; H01L 27/0886; H01L 27/0924; H01L 27/10826; H01L 29/41791; H01L 27/0922; H01L 21/823821; H01L 21/823842; H01L 21/823878; H01L 29/0653; H01L 29/42372; H01L 29/66545;
(Continued)

(56) References Cited

U.S. PATENT DOCUMENTS 8,586,436 B2   11/2013   Ng et al.
8,846,491 B1   9/2014   Pham et al.
(Continued)

FOREIGN PATENT DOCUMENTS

CN   103077947 A   5/2013
JP   2009158813 A   7/2009
(Continued)

*Primary Examiner* — Shahed Ahmed
(74) *Attorney, Agent, or Firm* — Almanac IP Advisors LLP

(57) ABSTRACT

Structures and formation methods of a semiconductor device structure are provided. The semiconductor device structure includes a fin structure over a semiconductor substrate. The semiconductor device structure also includes a gate stack covering a portion of the fin structure, and the gate stack includes a work function layer and a metal filling over the work function layer. The semiconductor device structure further includes an isolation element over the semiconductor substrate and adjacent to the gate stack. The isolation element is in direct contact with the work function layer and the metal filling.

20 Claims, 12 Drawing Sheets

Related U.S. Application Data continuation of application No. 16/017,795, filed on Jun. 25, 2018, now Pat. No. 10,686,059, which is a continuation of application No. 15/414,449, filed on Jan. 24, 2017, now Pat. No. 10,014,394, which is a division of application No. 14/725,555, filed on May 29, 2015, now Pat. No. 9,553,090.

(51) Int. Cl.

| | |
|---|---|
| *H01L 21/762* | (2006.01) |
| *H01L 21/8238* | (2006.01) |
| *H01L 27/092* | (2006.01) |
| *H01L 29/06* | (2006.01) |
| *H01L 29/08* | (2006.01) |
| *H01L 29/16* | (2006.01) |
| *H01L 29/161* | (2006.01) |
| *H01L 29/165* | (2006.01) |
| *H01L 29/24* | (2006.01) |
| *H01L 29/267* | (2006.01) |
| *H01L 29/423* | (2006.01) |
| *H01L 29/49* | (2006.01) |
| *H01L 29/51* | (2006.01) |
| *H01L 29/78* | (2006.01) |

(52) U.S. Cl.
CPC ............ *H01L 21/823814* (2013.01); *H01L 21/823821* (2013.01); *H01L 21/823842* (2013.01); *H01L 21/823857* (2013.01); *H01L 21/823878* (2013.01); *H01L 27/0924* (2013.01); *H01L 29/0653* (2013.01); *H01L 29/0847* (2013.01); *H01L 29/1608* (2013.01); *H01L 29/161* (2013.01); *H01L 29/165* (2013.01); *H01L 29/24* (2013.01); *H01L 29/267* (2013.01); *H01L 29/42372* (2013.01); *H01L 29/4966* (2013.01); *H01L 29/517* (2013.01); *H01L 29/66545* (2013.01); *H01L 29/66553* (2013.01); *H01L 29/66795* (2013.01); *H01L 29/7848* (2013.01); *H01L 29/785* (2013.01); *H01L 29/7851* (2013.01)

(58) Field of Classification Search
CPC ......... H01L 29/66772; H01L 29/66795; H01L 29/785; H01L 21/31111; H01L 21/76224; H01L 21/823814; H01L 21/823857; H01L 29/0847; H01L 29/1608; H01L 29/161; H01L 29/165; H01L 29/24; H01L 29/267; H01L 29/4966; H01L 29/517; H01L 29/7848; H01L 29/435; H01L 21/76801–76837; H10D 84/856; H10D 30/024; H10D 30/62; H10D 30/6211; H10D 62/822; H10D 62/832; H10D 64/017; H10D 64/018; H10D 84/017; H10D 84/0177

See application file for complete search history.

(56) References Cited

U.S. PATENT DOCUMENTS

| | | |
|---|---|---|
| 9,947,672 B2 | 4/2018 | Park et al. |
| 2001/0016385 A1* | 8/2001 | Chiang ............ H01L 27/11521 438/257 |
| 2005/0087810 A1 | 4/2005 | Sadra et al. |
| 2007/0281455 A1 | 12/2007 | Kim |
| 2008/0057672 A1 | 3/2008 | Rossi et al. |
| 2009/0166726 A1 | 7/2009 | Mine |
| 2012/0001259 A1 | 1/2012 | Chuang et al. |
| 2012/0286375 A1 | 11/2012 | Cai et al. |
| 2013/0037886 A1 | 2/2013 | Tsai et al. |
| 2013/0049069 A1 | 2/2013 | Zhu et al. |
| 2013/0105906 A1 | 5/2013 | Yin et al. |
| 2014/0001543 A1 | 1/2014 | Kim et al. |
| 2014/0042491 A1 | 2/2014 | Chen et al. |
| 2014/0061814 A1 | 3/2014 | Kim et al. |
| 2014/0151814 A1 | 6/2014 | Giles et al. |
| 2014/0227848 A1* | 8/2014 | Kang ............ H01L 21/823431 438/283 |
| 2014/0242775 A1 | 8/2014 | Lin et al. |
| 2014/0252486 A1 | 9/2014 | Lin et al. |
| 2014/0319623 A1 | 10/2014 | Tsai et al. |
| 2015/0054029 A1 | 2/2015 | Jangjian et al. |
| 2015/0054078 A1 | 2/2015 | Xie et al. |
| 2015/0069524 A1 | 3/2015 | Hong et al. |
| 2015/0118835 A1 | 4/2015 | Lin et al. |
| 2015/0236131 A1 | 8/2015 | Chang et al. |
| 2015/0243563 A1 | 8/2015 | Lee et al. |
| 2015/0311125 A1 | 10/2015 | Ju et al. |
| 2015/0325575 A1* | 11/2015 | Park ................. H01L 29/165 257/401 |
| 2015/0357468 A1 | 12/2015 | Zhu |
| 2015/0357472 A1 | 12/2015 | Huang et al. |
| 2015/0380305 A1 | 12/2015 | Basker et al. |
| 2015/0380407 A1 | 12/2015 | Ji et al. |
| 2016/0056181 A1 | 2/2016 | Anderson et al. |
| 2016/0104647 A1* | 4/2016 | Lin .................. H01L 21/76847 438/430 |
| 2016/0133632 A1* | 5/2016 | Park ................. H01L 21/02164 257/369 |
| 2016/0276342 A1 | 9/2016 | Lim et al. |
| 2016/0276357 A1* | 9/2016 | Su ................... H01L 27/11521 |
| 2016/0315087 A1 | 10/2016 | Tseng et al. |
| 2016/0329415 A1* | 11/2016 | He .................. H01L 21/02274 |
| 2016/0372381 A1 | 12/2016 | Tung |
| 2017/0243870 A1* | 8/2017 | Matsumoto ..... H01L 21/823842 |
| 2018/0174925 A1 | 6/2018 | Chang et al. |
| 2019/0305115 A1 | 10/2019 | Chang et al. |

FOREIGN PATENT DOCUMENTS

| | | |
|---|---|---|
| KR | 1020140006204 A | 1/2014 |
| KR | 20140034347 A | 3/2014 |
| KR | 20140111577 A | 9/2014 |
| TW | 201340218 A | 10/2013 |
| TW | 201349310 A | 12/2013 |

* cited by examiner

STRUCTURE OF SEMICONDUCTOR DEVICE STRUCTURE HAVING FINS

PRIORITY CLAIM AND CROSS-REFERENCE

This application is a continuation of U.S. patent application Ser. No. 16/902,190, filed Jun. 15, 2020, and entitled "Structure of Semiconductor Device Structure Having Fins," which is a continuation of U.S. patent application Ser. No. 16/017,795, filed on Jun. 25, 2018 (now U.S. Pat. No. 10,686,059 issued on Jun. 16, 2020), and entitled "Structure of Semiconductor Device Structure Having Fins," which is a continuation of U.S. patent application Ser. No. 15/414,449, filed on Jan. 24, 2017 (now U.S. Pat. No. 10,014,394 issued on Jul. 3, 2018), and entitled "Structure and Formation Method of Semiconductor Device with Metal Gate," which application claims the benefit to and is a divisional of U.S. patent application Ser. No. 14/725,555, filed on May 29, 2015 (now U.S. Pat. No. 9,553,090 issued on Jan. 24, 2017), and entitled "Structure and Formation Method of Semiconductor Device Structure," which applications are incorporated herein by reference.

This application is related to the co-pending and commonly assigned patent application U.S. patent application Publication Ser. No. 14/725,118, filed on May 29, 2015 and entitled "Structure and formation method of semiconductor device structure", the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e. the number of interconnected devices per chip area) has generally increased while geometric size (i.e. the smallest component (or line) that can be created using a fabrication process) has decreased. This scaling down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
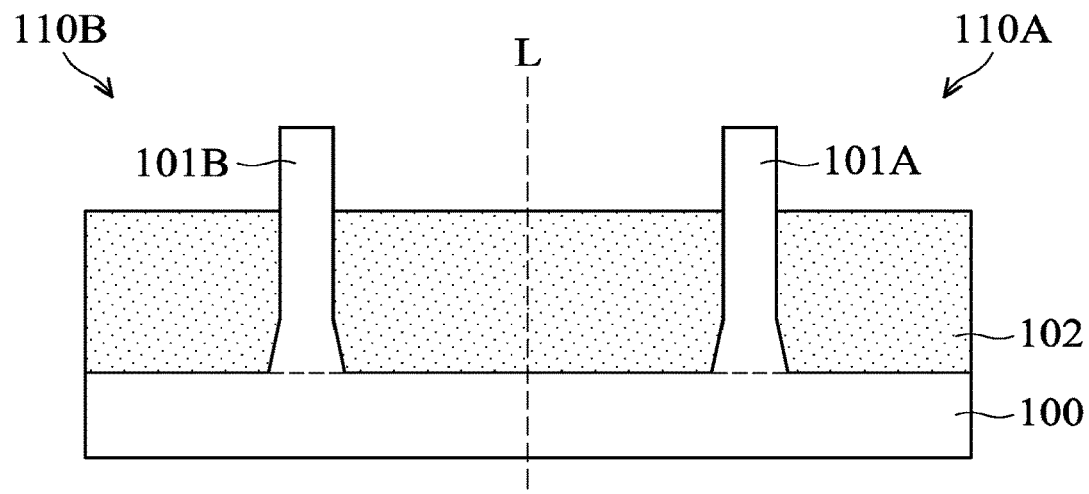
FIGS. 1A-1I are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. FIGS. 1A-1I are cross-sectional views of various stages of a process for forming a semiconductor device structure, in accordance with some embodiments. Additional operations can be provided before, during, and/or after the stages described in FIGS. 1A-1I. Some of the stages that are described can be replaced or eliminated for different embodiments. Additional features can be added to the semiconductor device structure. Some of the features described below can be replaced or eliminated for different embodiments.

As shown in FIG. 1A, a semiconductor substrate 100 is provided. In some embodiments, the semiconductor substrate 100 is a bulk semiconductor substrate, such as a semiconductor wafer. For example, the semiconductor substrate 100 is a silicon wafer. The semiconductor substrate 100 may include silicon or another elementary semiconductor material such as germanium. In some other embodiments, the semiconductor substrate 100 includes a compound semiconductor. The compound semiconductor may include gallium arsenide, silicon carbide, indium arsenide, indium phosphide, another suitable compound semiconductor, or a combination thereof.

In some embodiments, the semiconductor substrate 100 includes a semiconductor-on-insulator (SOI) substrate. The SOI substrate may be fabricated using a separation by implantation of oxygen (SIMOX) process, a wafer bonding process, another applicable method, or a combination thereof.

As shown in FIG. 1A, the semiconductor substrate 100 is separated into portions 110A and 110B by an imaginary line L. In some embodiments, two or more transistors are formed in and/or over the portions 110A and 110B of the semiconductor substrate 100. In some embodiments, a p-type metal-oxide-semiconductor field effect transistor (PMOSFET) and an n-type metal-oxide-semiconductor field effect transistor (NMOSFET) will be formed in and/or over the portions 110A and 110B, respectively. In some other embodiments, an NMOSFET and a PMOSFET will be formed in and/or over the portions 110A and 110B, respectively. In some other embodiments, NMOSFETs will be formed in and/or over the portions 110A and 110B. In some other embodiments, PMOSFETs will be formed in and/or over the portions 110A and 110B.

As shown in FIG. 1A, multiple recesses (or trenches) are formed in the semiconductor substrate 100, in accordance with some embodiments. As a result, multiple fin structures including fin structures 101A and 101B are formed between the recesses. In some embodiments, one or more photolithography and etching processes are used to form the recesses.

As shown in FIG. 1A, isolation features 102 are formed in the recesses to surround lower portions of the fin structures 101A and 101B, in accordance with some embodiments. The isolation features 102 are used to define and electrically isolate various device elements formed in and/or over the semiconductor substrate 100. In some embodiments, the isolation features 102 include shallow trench isolation (STI) features, local oxidation of silicon (LOCOS) features, another suitable isolation feature, or a combination thereof.

In some embodiments, each of the isolation features 102 has a multi-layer structure. In some embodiments, the isolation features 102 are made of a dielectric material. The dielectric material may include silicon oxide, silicon nitride, silicon oxynitride, fluoride-doped silicate glass (FSG), low-K dielectric material, another suitable material, or a combination thereof. In some embodiments, an STI liner (not shown) is formed to reduce crystalline defects at the interface between the semiconductor substrate 100 and the isolation features 102. Similarly, the STI liner may also be used to reduce crystalline defects at the interface between the fin structures and the isolation features 102.

In some embodiments, a dielectric material layer is deposited over the semiconductor substrate 100. The dielectric material layer covers the fin structures including the fin structures 101A and 101B and fills the recesses between the fin structures. In some embodiments, the dielectric material layer is deposited using a chemical vapor deposition (CVD) process, a spin-on process, another applicable process, or a combination thereof. In some embodiments, a planarization process is performed to thin down the dielectric material layer until the fin structures 101A and 101B are exposed. The planarization process may include a chemical mechanical polishing (CMP) process, a grinding process, an etching process, another applicable process, or a combination thereof. Afterwards, the dielectric material layer is etched back to form the isolation features 102. The fin structures including the fin structures 101A and 101B protrude from the isolation features 102, as shown in FIG. 1A in accordance with some embodiments.

Figure 1B:
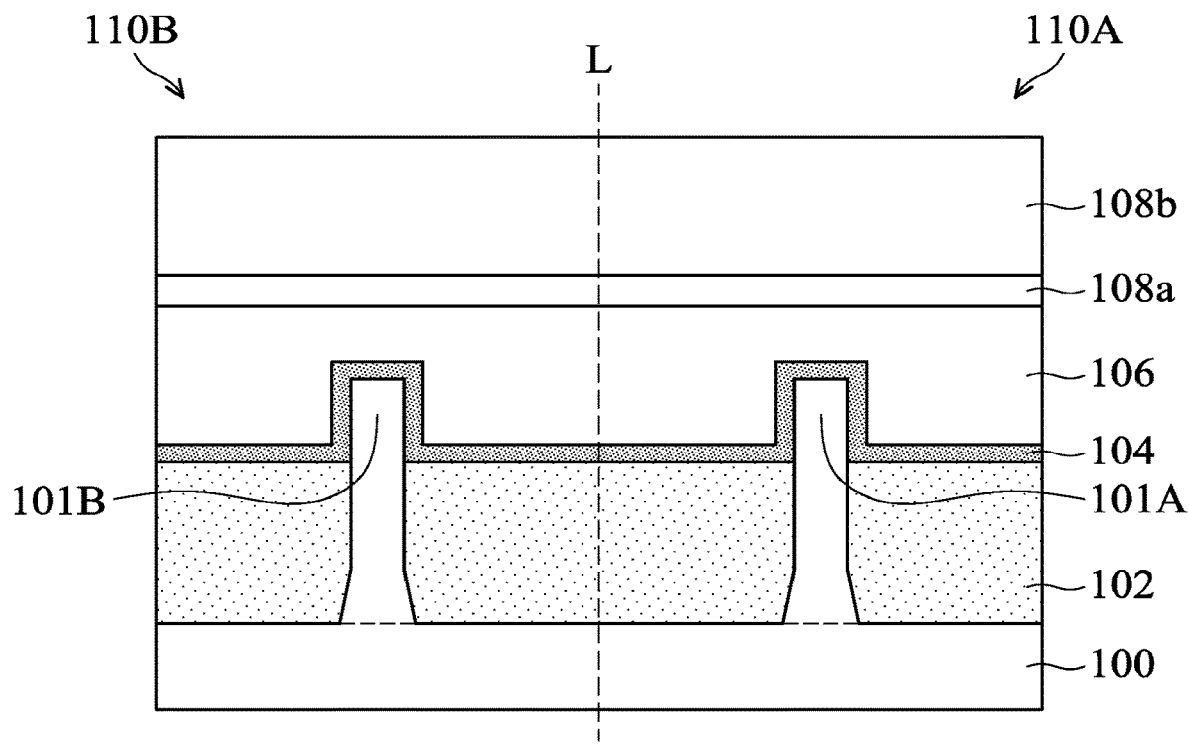

As shown in FIG. 1B, a gate dielectric layer 104 and a dummy gate electrode layer 106 are deposited over the isolation features 102 and the fin structures 101A and 101B, in accordance with some embodiments. In some embodiments, the gate dielectric layer 104 is made of silicon oxide, silicon nitride, silicon oxynitride, dielectric material with high dielectric constant (high-K), another suitable dielectric material, or a combination thereof. Examples of high-K dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof. In some embodiments, the gate dielectric layer 104 is a dummy gate dielectric layer which will be removed subsequently. The dummy gate dielectric layer is, for example, a silicon oxide layer.

In some embodiments, the gate dielectric layer 104 is deposited using a chemical vapor deposition (CVD) process, an atomic layer deposition (ALD) process, a thermal oxidation process, a physical vapor deposition (PVD) process, another applicable process, or a combination thereof. In some embodiments, the dummy gate electrode layer 106 is made of polysilicon. For example, the dummy gate electrode layer 106 is deposited using a CVD process or another applicable process. Many variations and/or modifications can be made to embodiments of the disclosure. In some embodiments, the gate dielectric layer 104 is not formed.

Afterwards, a patterned hard mask layer is formed over the dummy gate electrode layer 106, as shown in FIG. 1B in accordance with some embodiments. The patterned hard mask layer is used to pattern the dummy gate electrode layer 106 and the gate dielectric layer 104 into one or more dummy gate stacks (or dummy gate lines). In some embodiments, the patterned hard mask includes a first hard mask layer 108a and a second hard mask layer 108b. In some embodiments, the first hard mask layer 108a is made of silicon nitride. In some embodiments, the second hard mask layer 108b is made of silicon oxide. In some embodiments, the second hard mask layer 108b is thicker than the first mask layer 108a.

In some embodiments, the dummy gate stacks are multiple dummy gate lines formed over the isolation features 102 and the fin structures 101A and 101B. In some embodiments, the dummy gate lines are substantially parallel to each other. In some embodiments, each of the dummy gate stacks (or dummy gate lines) is formed into two or more gate stacks of different transistors in subsequent processes.

In some embodiments, a patterned photoresist layer (not shown) is used to assist in the formation of the patterned hard mask layer. The patterned photoresist layer is formed using a photolithography process. The photolithography process may include photoresist coating (e.g., spin-on coating), soft baking, mask aligning, exposure, post-exposure baking, developing the photoresist, rinsing, drying (e.g., hard baking), another suitable process, or a combination thereof.

Figure 1C:
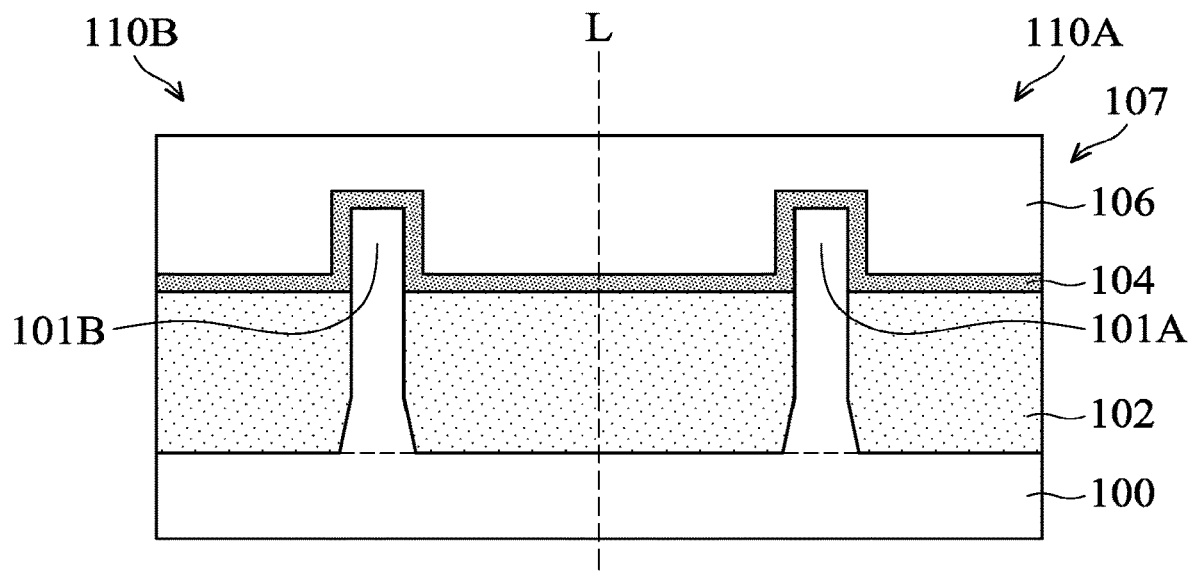
Figure 2A:
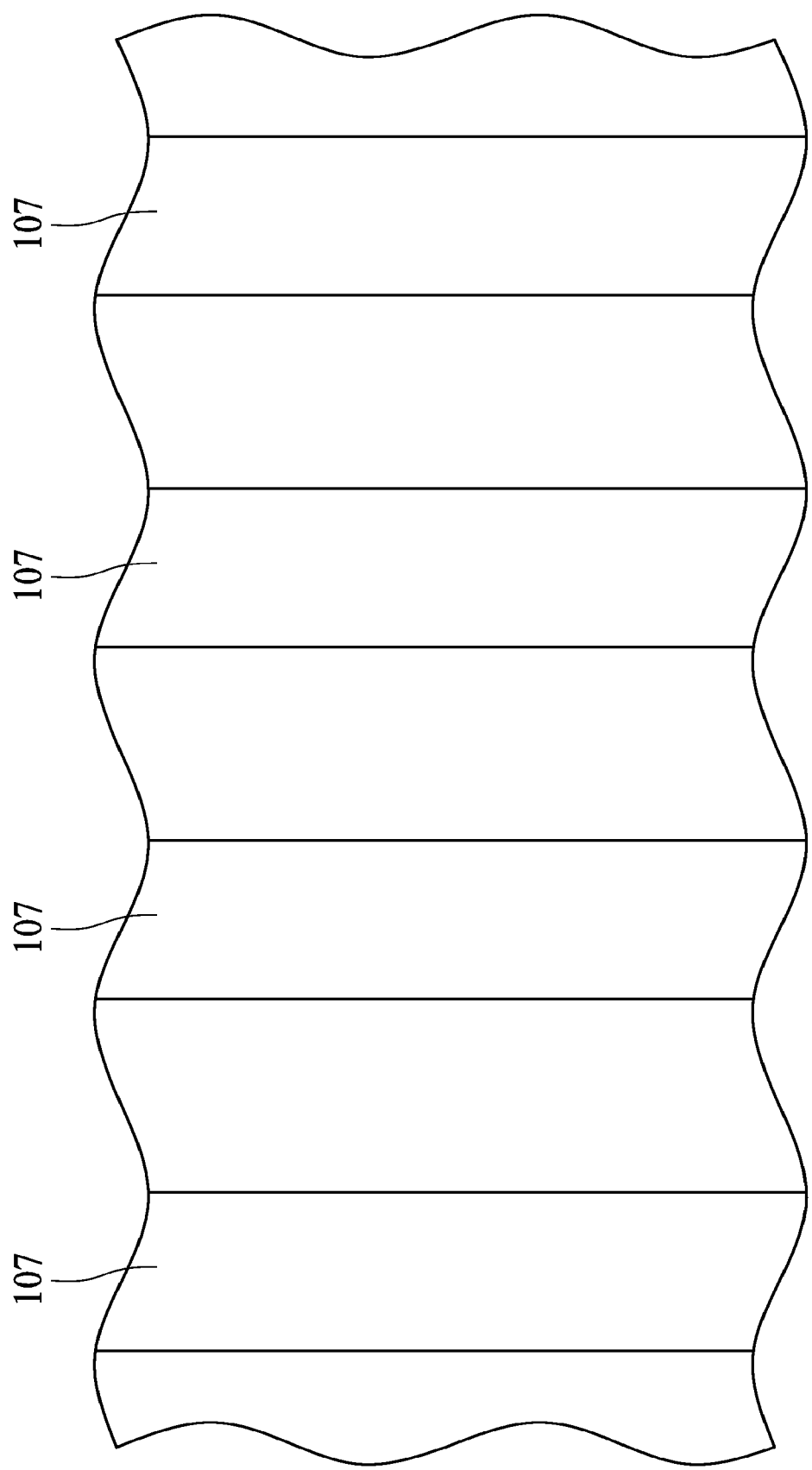
FIGS. 2A-2G are top views of various stages of a process for forming a semiconductor device structure, in accordance with some embodiments.

Afterwards, the dummy gate electrode layer 106 and the gate dielectric layer 104 are patterned to form one or more dummy gate stacks 107, as shown in FIG. 1C in accordance with some embodiments. In some embodiments, the hard mask layers 108a and 108b are removed afterwards. FIGS. 2A-2G are top views of various stages of a process for forming a semiconductor device structure, in accordance with some embodiments. In some embodiments, FIG. 2A is a top view of the structure shown in FIG. 1C. As shown in FIGS. 1C and 2A, multiple dummy gate stacks 107 are formed, in accordance with some embodiments. For brevity, only the dummy gate stacks 107 (or dummy gate lines) are shown in FIG. 2A. Each of the dummy gate stacks 107 includes the dummy gate electrode layer 106 and the gate dielectric layer 104. In FIGS. 1C and 2B-2G, only one of the dummy gate stacks 107 is shown for the sake of brevity.

Afterwards, source/drain structures are formed over the fin structures 101A and 101B and adjacent to the dummy gate stack 107, in accordance with some embodiments.

Figure 2C:
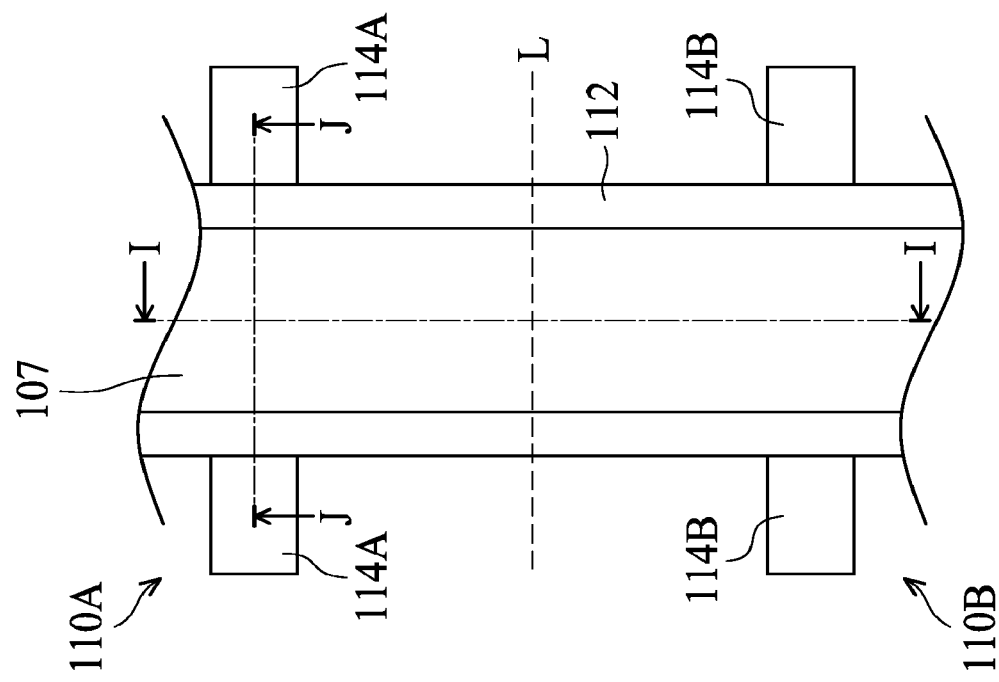
Figure 2B:
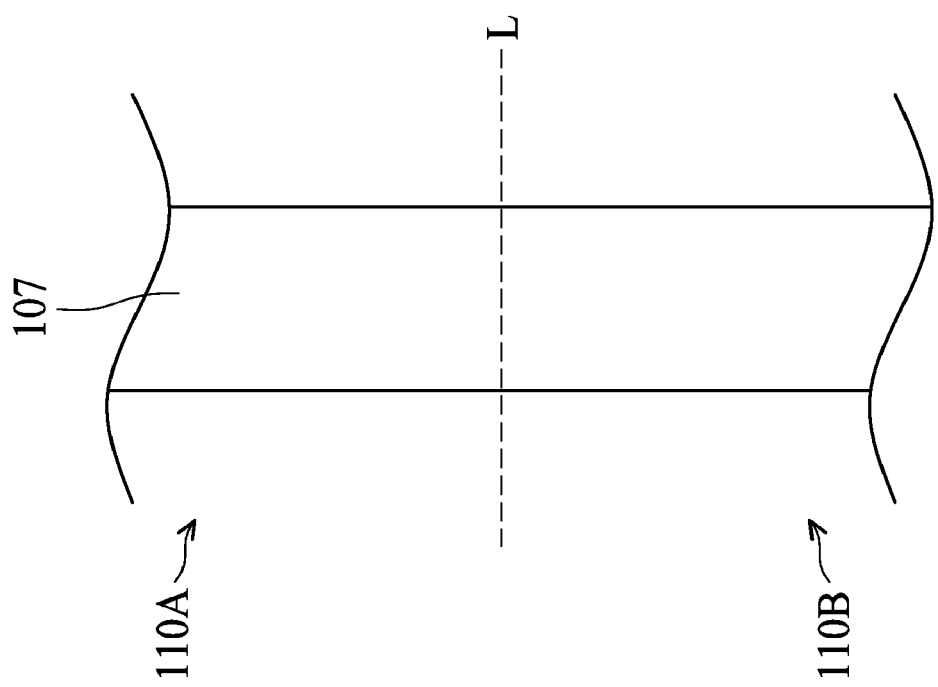
Figure 2E:
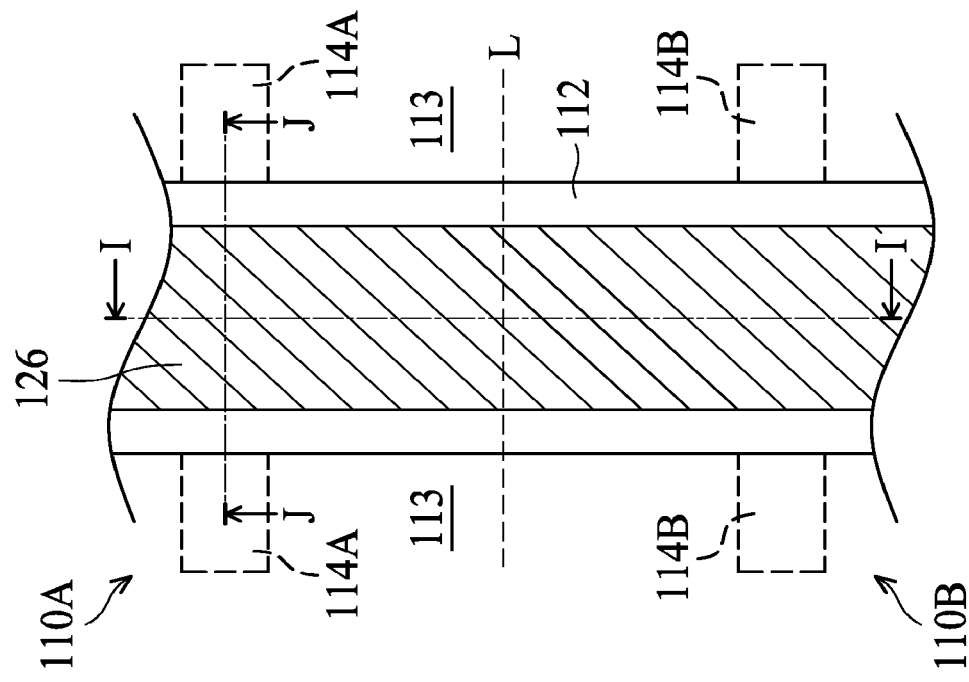
Figure 2D:
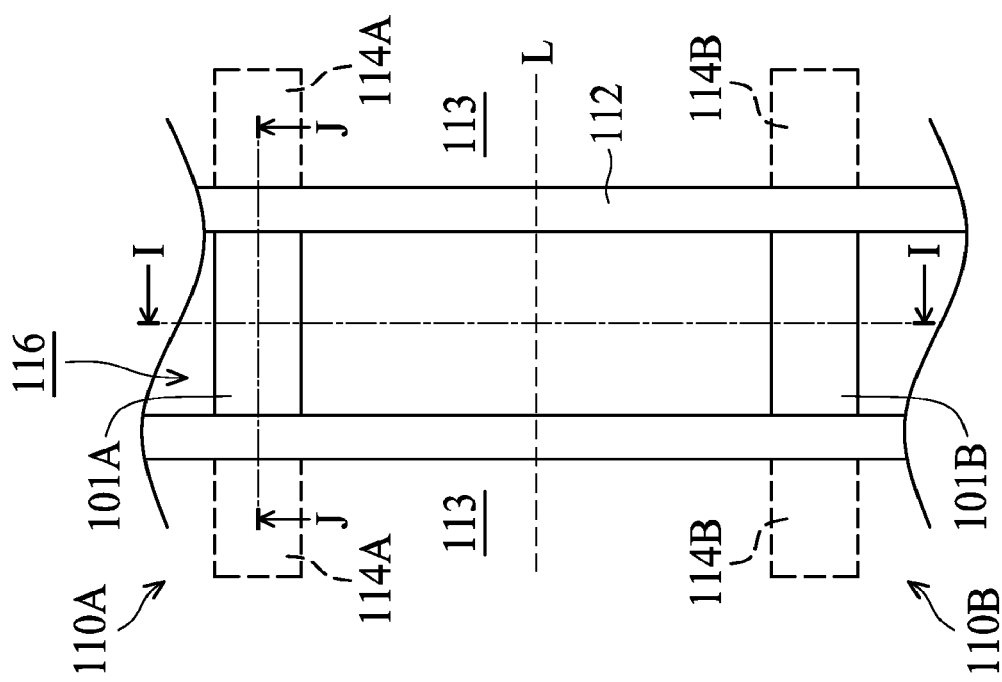
Figure 2G:
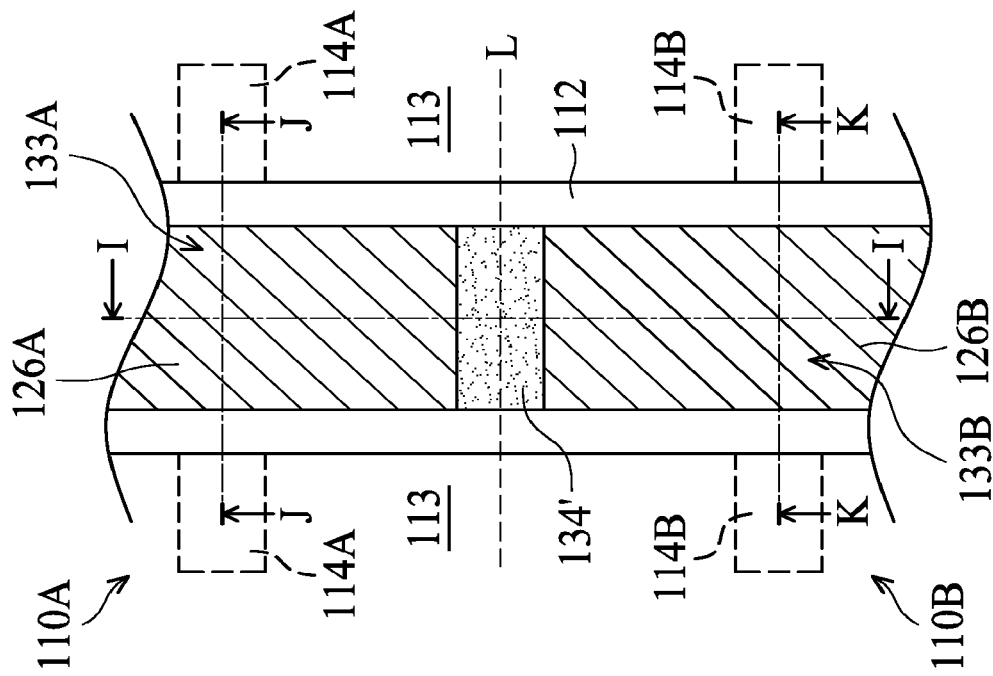
Figure 2F:
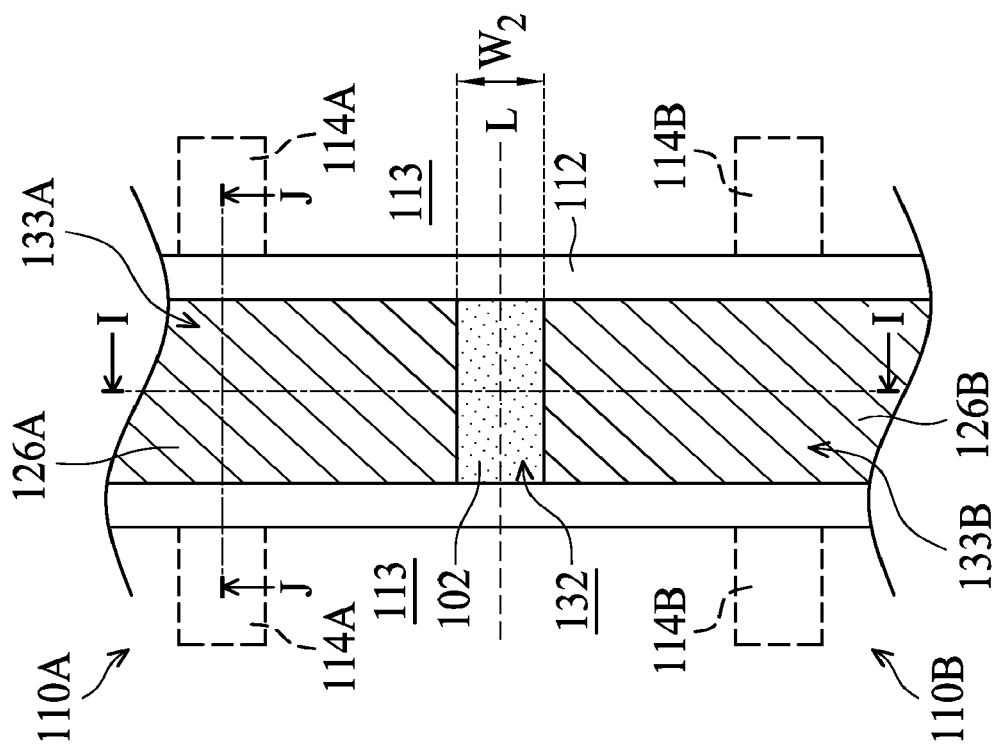
Figure 3A:
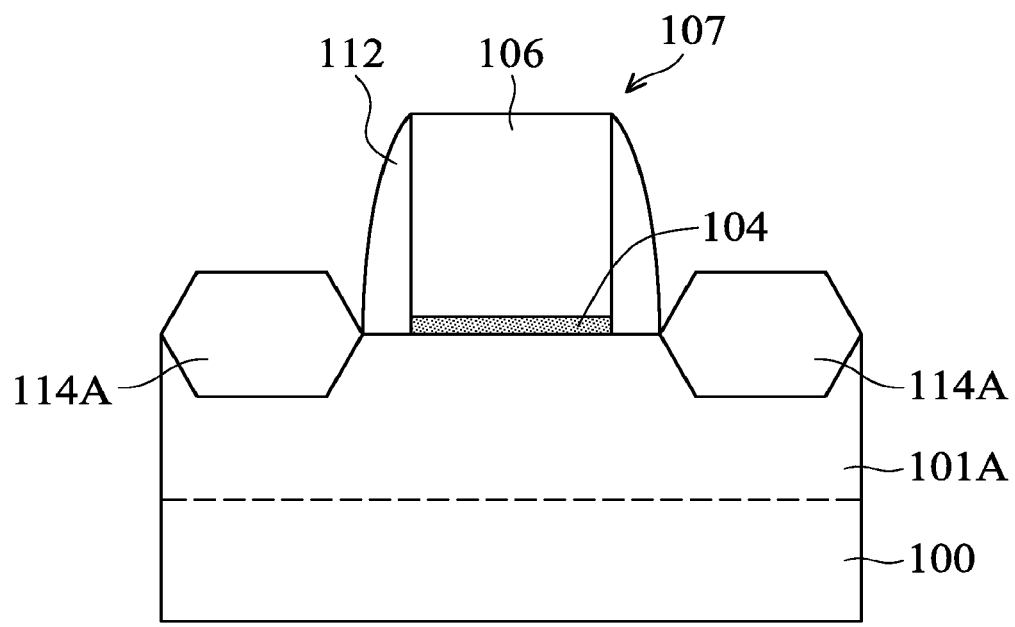
FIGS. 3A-3D are cross-sectional views of various stages of a process for forming a semiconductor device structure, in accordance with some embodiments.
Figure 3B:
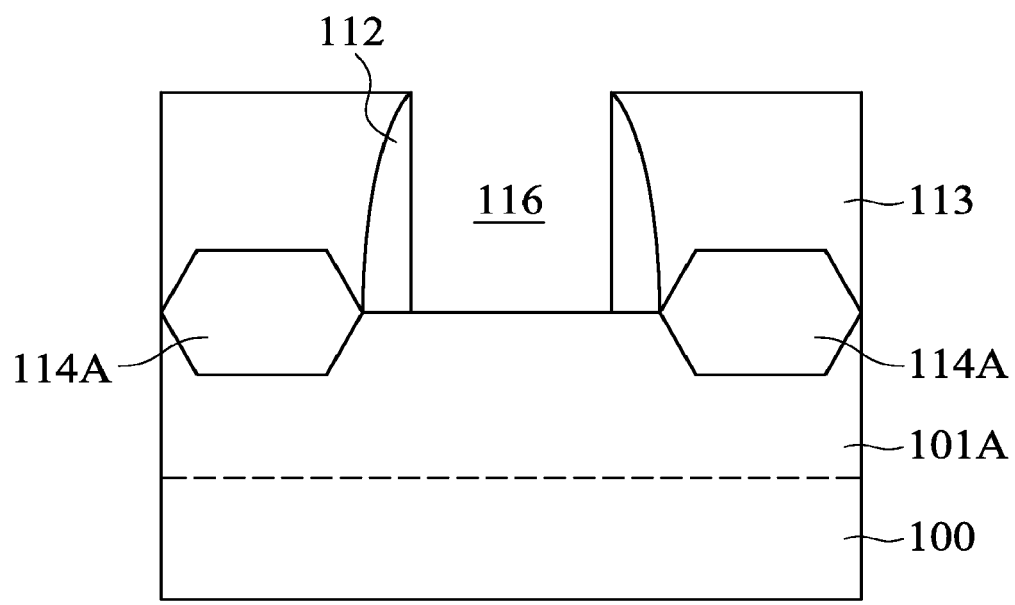
Figure 3C:
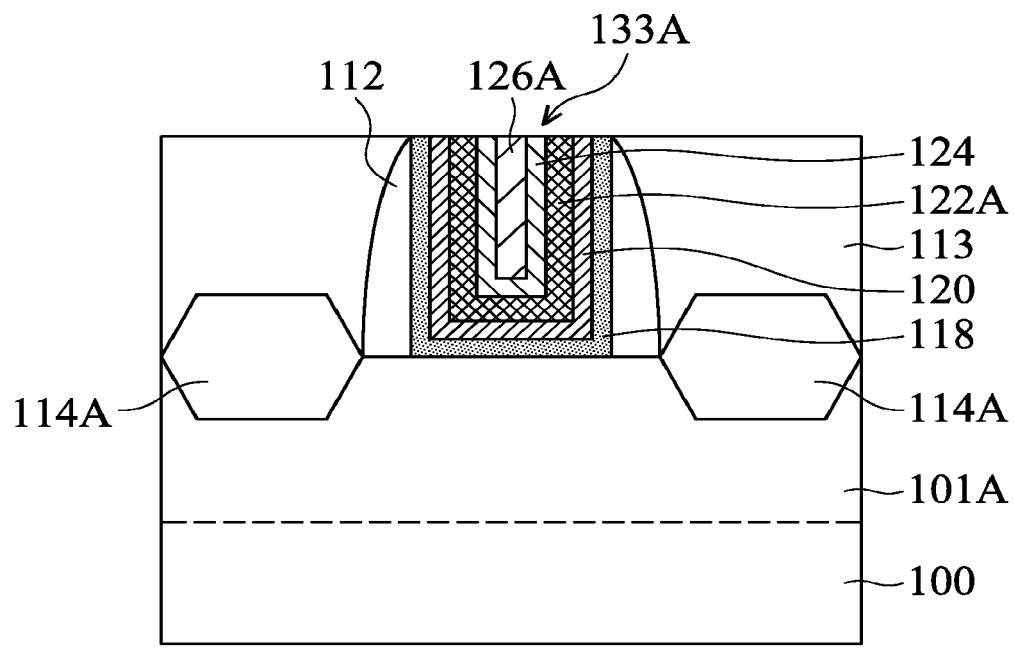

FIGS. 3A-3D are cross-sectional views of various stages of a process for forming a semiconductor device structure, in accordance with some embodiments. In some embodiments, FIGS. 1C-1I are cross-sectional views taken along the line I-I of FIGS. 2B-2G. In some embodiments, FIGS. 3A-3C are cross-sectional views taken along the line J-J of FIGS. 2C-2G, and FIG. 3D is a cross-sectional view taken along the line K-K of FIG. 2G.

Referring to FIGS. 2C and 3A, source/drain structures 114A and 114B are formed over the semiconductor substrate 100 and between the dummy gate stack 107, in accordance with some embodiments. As mentioned above, in some embodiments, two transistors are formed in and/or over the portions 110A and 110B of the semiconductor substrate 100. The source/drain structures 114A are a portion of the transistor formed in and/or over the portion 110A, and the source/drain region 114B are a portion of another transistor formed in and/or over the portion 110B.

In some embodiments, the fin structures 101A and 101B are recessed to be lower than top surfaces of the isolation features 102, in accordance with some embodiments. In some embodiments, an etching process is performed to remove upper portions of the fin structures 101A and 101B. As a result, recesses are formed above the fin structures 101A (and 101B), as shown in FIG. 3A. In some other embodiments, multiple etching operations are used so that the recesses further extend laterally towards channel regions below the dummy gate stack 107.

In some embodiments, a semiconductor material (or two or more semiconductor materials) is epitaxially grown over the fin structures that are recessed, growing continually to above the recesses, to form the source/drain structures 114A and 114B. In some embodiments, the growth of the source/drain structures 114A and 114B are performed simultaneously. In some embodiments, the growth of the source/drain structures 114A and 114B are performed separately in different processes.

In some embodiments, the source/drain structures 114A are a p-type semiconductor material. For example, the source/drain structures 114A may include epitaxially grown silicon germanium. The source/drain structures 114A are not limited to being a p-type semiconductor material. In some embodiments, the source/drain structures 114A are an n-type semiconductor material. The source/drain structures 114A may include epitaxially grown silicon, epitaxially grown silicon carbide (SiC), epitaxially grown silicon phosphide (SiP), or another suitable epitaxially grown semiconductor material.

In some embodiments, both of the source/drain structures 114A and 114B are p-type. In some embodiments, both of the source/drain structures 114A and 114B are n-type. In some embodiments, one of the source/drain structures 114A and 114B is p-type, and the other of the source/drain structures 114A and 114B is n-type.

In some embodiments, the source/drain structures 114A and 114B are formed using a selective epitaxy growth (SEG) process, a CVD process (e.g. a vapor-phase epitaxy (VPE) process, a low pressure chemical vapor deposition (LPCVD) process, and/or an ultra-high vacuum CVD (UHV-CVD) process), a molecular beam epitaxy process, another applicable process, or a combination thereof. The formation process of the source/drain structures 114A and 114B may use gaseous and/or liquid precursors. In some embodiments, both the source/drain structures 114A and 114B are grown in-situ in the same process chamber. In other words, the source/drain structures 114A and 114B are formed using an in-situ epitaxial growth process. In some other embodiments, the source/drain structures 114A and 114B are grown separately.

The source/drain structures 114A and 114B include dopants. In some embodiments, multiple implantation processes are performed to dope the source/drain structures 114A and 114B. In some embodiments, spacer elements 112 are formed over sidewalls of the dummy gate stack 107 to assist in the formation of the source/drain structures 114A and 114B, as shown in FIGS. 2C and 3A. In some embodiments, light doped source/drain regions (not shown) are formed using ion implantation processes before the spacer elements 112 are formed.

In some embodiments, the source/drain structures 114A and 114B are doped in-situ during the growth of the source/drain structures 114A and 114B. In some other embodiments, the source/drain structures 114A and 114B are not doped during the growth of the source/drain structures 114A and 114B. After the epitaxial growth, the source/drain structures 114A and 114B are doped in a subsequent process. In some embodiments, the doping is achieved using an ion implantation process, a plasma immersion ion implantation process, a gas and/or solid source diffusion process, another applicable process, or a combination thereof. In some embodiments, the source/drain structures 114A and 114B are further exposed to annealing processes to activate the dopants. For example, a rapid thermal annealing process is performed.

Figure 1D:
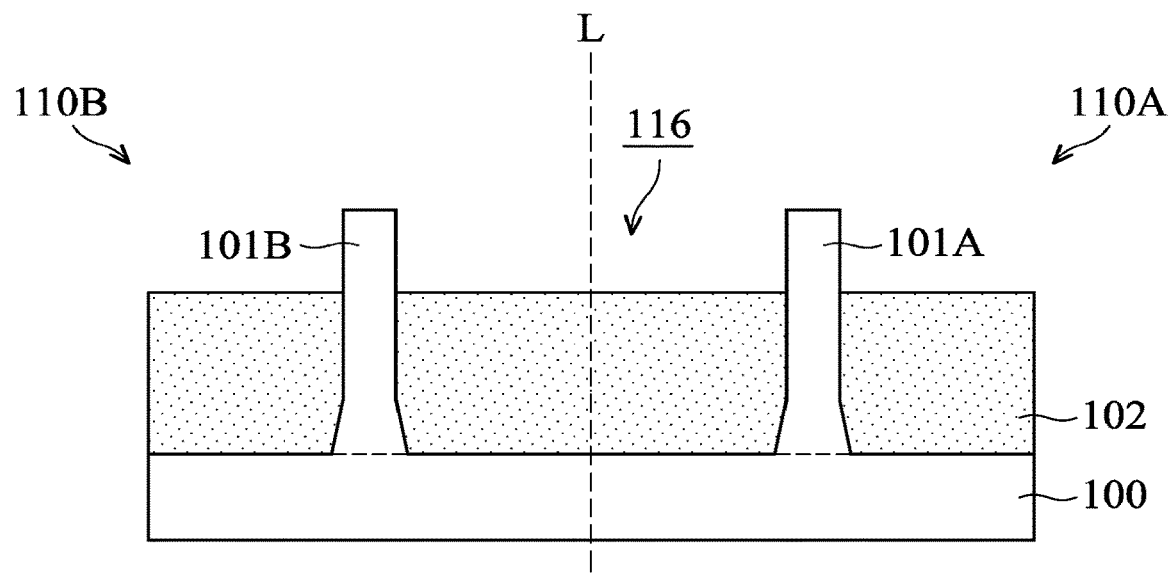

As shown in FIGS. 1D, 2D, and 3B, the dummy gate stacks 107 are removed, in accordance with some embodiments. In some embodiments, before the removal of the dummy gate stacks 107, a dielectric layer 113 is deposited over the source/drain structures 114A and 114B and the dummy gate stacks 107, as shown in FIGS. 2D and 3B. In some embodiments, the dielectric layer 113 is made of silicon oxide, silicon oxynitride, borosilicate glass (BSG), phosphoric silicate glass (PSG), borophosphosilicate glass (BPSG), fluorinated silicate glass (FSG), low-k material, porous dielectric material, another suitable dielectric material, or a combination thereof. In some embodiments, the dielectric layer 113 is deposited using a CVD process, a spin-on process, an ALD process, a PVD process, another applicable process, or a combination thereof.

Afterwards, the dielectric layer 113 is thinned down until the dummy gate electrode layer 106 is exposed. The thinned dielectric layer 113 surrounds the dummy gate stacks 107. In some embodiments, the dielectric layer 113 is thinned down using a planarization process. The planarization process may include a chemical mechanical polishing (CMP) process, a grinding process, an etching process, another applicable process, or a combination thereof. Many variations and/or modifications can be made to embodiments of the disclosure. In some other embodiments, the dielectric layer 113 is not formed.

Afterwards, the dummy gate stacks 107 are removed to form a trench 116 over the fin structures 101A and 101B and the isolation features 102, as shown in FIGS. 1D, 2D, and 3B in accordance with some embodiments. In some embodiments, the dielectric layer 113 is formed, and the trench 116 is formed in the dielectric layer 113. In other words, the dielectric layer 113 surrounds the trench 116. In some embodiments, the trench 116 is between the spacer elements 112. In some embodiments, the trench 116 exposes the portions of the fin structures 101A and 101B that are originally covered by the dummy gate stacks 107, as shown in FIGS. 1D, 2D, and 3B. The exposed portions of fin structures 101A and 101B may serve as channel regions. In some embodiments, the dummy gate stack 107 is removed using a dry etching process, a wet etching process, another applicable process, or a combination thereof. In some embodiments, the gate dielectric layer 104 is made of a high-K material and is not removed. In these cases, the trench 116 exposes the gate dielectric layer 104.

Figure 1E:
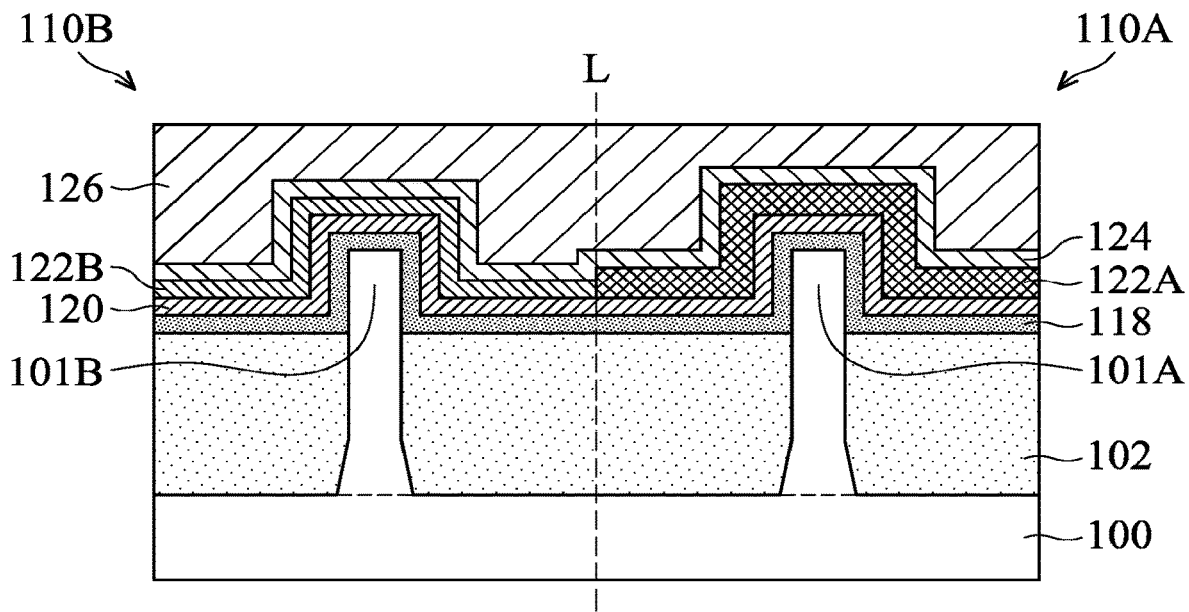

After the removal of the dummy gate stacks 107, metal gate stack layers are deposited over the sidewalls and bottom of the trench 116, as shown in FIGS. 1E, 2E, 3C, and 3D in accordance with some embodiments. The metal gate stack layers extend along sidewalls and tops of the fin structures 101A and 101B, as shown in FIG. 1E. The metal gate stack layers in the trench 116 may also be called a metal gate stack line.

As mentioned above, in some embodiments, each of the dummy gate stacks 107 (or dummy gate lines) will be formed into two or more gate stacks of different transistors. Therefore, the trench 116 formed after the removal of the dummy gate stack 107 is long enough to contain two or more metal gate stacks of transistors. The depositions or fillings of the metal gate stack layers are easier than other cases where the depositions or fillings of the metal gate stack layers are performed in a recess designed to contain only one metal gate stack of a transistor. As a result, the process window is enlarged significantly.

In some embodiments, the metal gate stack layers include a gate dielectric layer, a work function layer, and a metal filling layer. In some embodiments, two transistors are formed in and/or over the portions 110A and 110B of the semiconductor substrate 100. In some embodiments, one of the transistors is a p-type transistor, and the other one is an n-type transistor. In some embodiments, both of the transistors are p-type transistors. In some embodiments, both of the transistors are n-type transistors. In some embodiments, one or more p-type work function layers are formed over the portion 110A, and one or more n-type work function layers are formed over the portion 110B. In some embodiments, one or more n-type work function layers are formed over the portion 110A, and one or more p-type work function layers are formed over the portion 110B.

Figure 3D:
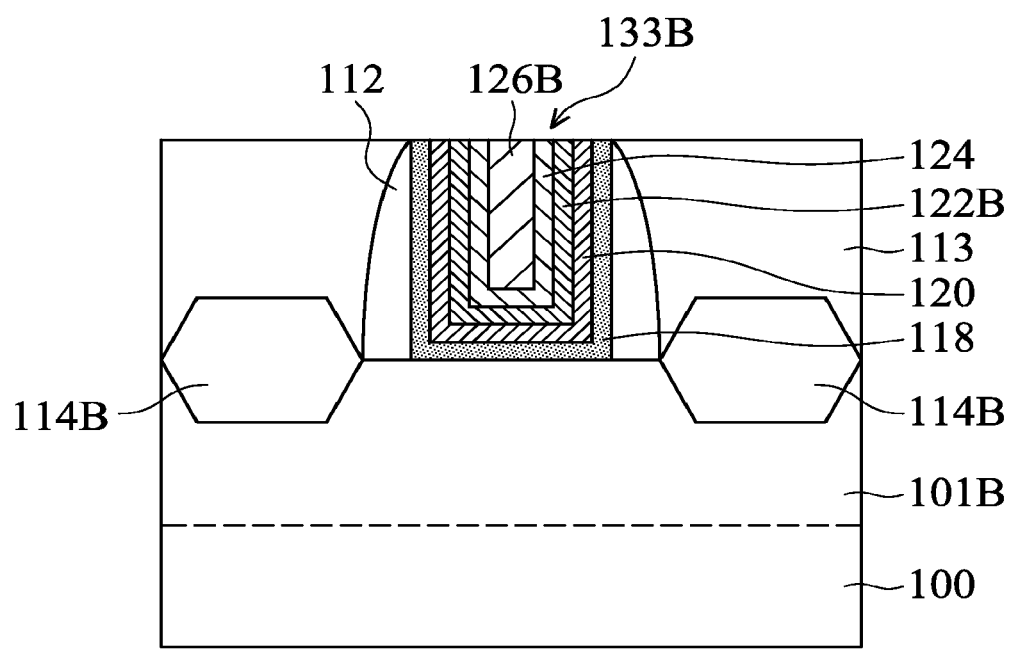

As shown in FIGS. 1E, 3C, and 3D, a gate dielectric layer 118 is deposited over the sidewalls and bottom of the trench 116, in accordance with some embodiments. In some embodiments, the gate dielectric layer 118 extends over both of the portions 110A and 110B. In some embodiments, the gate dielectric layer 118 is a high-k dielectric layer. The high-k dielectric layer may be made of hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof.

In some embodiments, the gate dielectric layer 118 is deposited using an ALD process, a CVD process, a spin-on process, another applicable process, or a combination thereof. In some embodiments, a high temperature annealing operation is performed to reduce or eliminate defects in the gate dielectric layer 118. Many variations and/or modifications can be made to embodiments of the disclosure. In some embodiments, two different gate dielectric layers are formed over the portions 110A and 110B to serve as the gate dielectric layers of different transistors.

In some other embodiments, before the gate dielectric layer 118 is formed, an interfacial layer (not shown) is formed in the trench 116. The interfacial layer may be used to reduce stress between the gate dielectric layer 118 and the fin structures 101A and 101B. In some embodiments, the interfacial layer is made of silicon oxide. In some embodiments, the interfacial layer is formed using an ALD process, a thermal oxidation process, another applicable process, or a combination thereof.

As shown in FIGS. 1E, 3C, and 3D, a barrier layer 120 is deposited over the gate dielectric layer 118, in accordance with some embodiments. The barrier layer 120 may be used to interface the gate dielectric layer 118 with subsequently formed work function layers. The barrier layer 120 may also be used to prevent diffusion between the gate dielectric layer 118 and the subsequently formed work function layers.

In some embodiments, the barrier layer 120 is made of a metal-containing material. The metal-containing material may include titanium nitride, tantalum nitride, another suitable material, or a combination thereof. In some embodiments, the barrier layer 120 includes multiple layers. In some embodiments, the barrier layer 120 is deposited using an ALD process, a PVD process, an electroplating process, an electroless plating process, a CVD process, another applicable process, or a combination thereof. In some other embodiments, the barrier layer 120 is not formed. In some embodiments, two different barrier layers are formed over the portions 110A and 110B to serve as the barrier layers of different transistors.

Afterwards, work function layers 122A and 122B are formed over the barrier layer 120, as shown in FIGS. 1E, 3C, and 3D in accordance with some embodiments. The work function layer is used to provide desired work function for transistors to enhance device performance including improved threshold voltage. In the embodiments of forming an NMOS transistor, the work function layer can be an n-type metal layer. The n-type metal layer is capable of providing a work function value suitable for the device, such as equal to or less than about 4.5 eV. The n-type metal layer may include metal, metal carbide, metal nitride, or a combination thereof. For example, the n-type metal layer includes titanium nitride, tantalum, tantalum nitride, another suitable material, or a combination thereof.

On the other hand, in the embodiments of forming a PMOS transistor, the work function layer can be a p-type metal layer. The p-type metal layer is capable of providing a work function value suitable for the device, such as equal to or greater than about 4.8 eV. The p-type metal layer may include metal, metal carbide, metal nitride, other suitable materials, or a combination thereof. For example, the p-type metal includes tantalum nitride, tungsten nitride, titanium, titanium nitride, other suitable materials, or a combination thereof.

The work function layer may also be made of hafnium, zirconium, titanium, tantalum, aluminum, metal carbides (e.g. hafnium carbide, zirconium carbide, titanium carbide, aluminum carbide), aluminides, ruthenium, palladium, platinum, cobalt, nickel, conductive metal oxides, or a combinations thereof. The thickness and/or the compositions of the work function layer may be fine-tuned to adjust the work function level. For example, a titanium nitride layer may be used as a p-type metal layer or an n-type metal layer, depending on the thickness and/or the compositions of the titanium nitride layer.

In some embodiments, the work function layer 122A is a p-type metal layer, and the work function layer 122B is an n-type metal layer. In some embodiments, the work function layer 122A is formed before the work function layer 122B. The work function layer 122A is deposited over the barrier layer 120. Afterwards, the work function layer 122A is patterned. For example, the work function layer 122A is positioned over the portion 110A of the semiconductor substrate 100. The portion of the work function layer 122A originally over the portion 110B is removed. For example, a photolithography process and an etching process are used to pattern the work function layer 122A. Similarly, the work function layer 122B is deposited and patterned over the portion 110B of the semiconductor substrate 100.

Many variations and/or modifications can be made to embodiments of the disclosure. In some other embodiments, the work function layer 122B is formed before the work function layer 122A. In some other embodiments, both of the work function layers 122A and 122B have the same conductivity type, such as n-type or p-type.

Afterwards, a blocking layer 124 is deposited over the work function layers 122A and 122B, as shown in FIGS. 1E, 3C, and 3D in accordance with some embodiments. The blocking layer 124 may be used to prevent a subsequently formed metal filling layer from diffusing or penetrating into the work function layers. In some embodiments, the blocking layer 124 is made of tantalum nitride, titanium nitride, another suitable material, or a combination thereof. In some embodiments, the blocking layer 124 is deposited using an ALD process, a PVD process, an electroplating process, an electroless plating process, another applicable process, or a combination thereof.

Embodiments of the disclosure are not limited thereto. In some other embodiments, the blocking layer 124 is not formed. In some other embodiments, two different blocking layers are used between the subsequently formed metal filing layers and the different work function layers 122A and 122B.

Afterwards, a metal filling layer 126 is deposited over the blocking layer 124 to fill the trench 116, as shown in FIGS. 1E, 2E, 3C, and 3D in accordance with some embodiments. In some embodiments, the metal filling layer 126 is made of tungsten, aluminum, copper, cobalt, another suitable material, or a combination thereof. In some embodiments, the metal filling layer 126 is deposited using a PVD process, a CVD process, an electroplating process, an electroless plating process, another applicable process, or a combination thereof. In some other embodiments, the metal filling layer 126 is not formed. In some other embodiments, two different metal filling layers are formed over the portions 110A and 110B to serve as the metal filing layers of different transistors.

In some embodiments, a first set of metal gate stack layers are formed over the portion 110A, and the portion 110B is blocked by, for example, a patterned mask. Afterwards, a second set of metal gate stack layers are formed over the portion 110B, and the first set of metal gate stack layers are covered by another patterned mask.

In some embodiments, the metal gate stack layers, including the gate dielectric layer 118, the barrier layer 120, the work function layers 122A and 122B, the blocking layer 124, and the metal filling layer 126, together fill the trench 116 and cover the dielectric layer 113. In some embodiments, the portion of the metal gate stack layers outside of the trench 116 is removed. For example, a planarization process is used to partially remove the metal gate stack layers until the dielectric layer 113 is exposed. The planarization process may include a CMP process, a grinding process, an etching process, another applicable process, or a combination thereof.

Figure 1F:
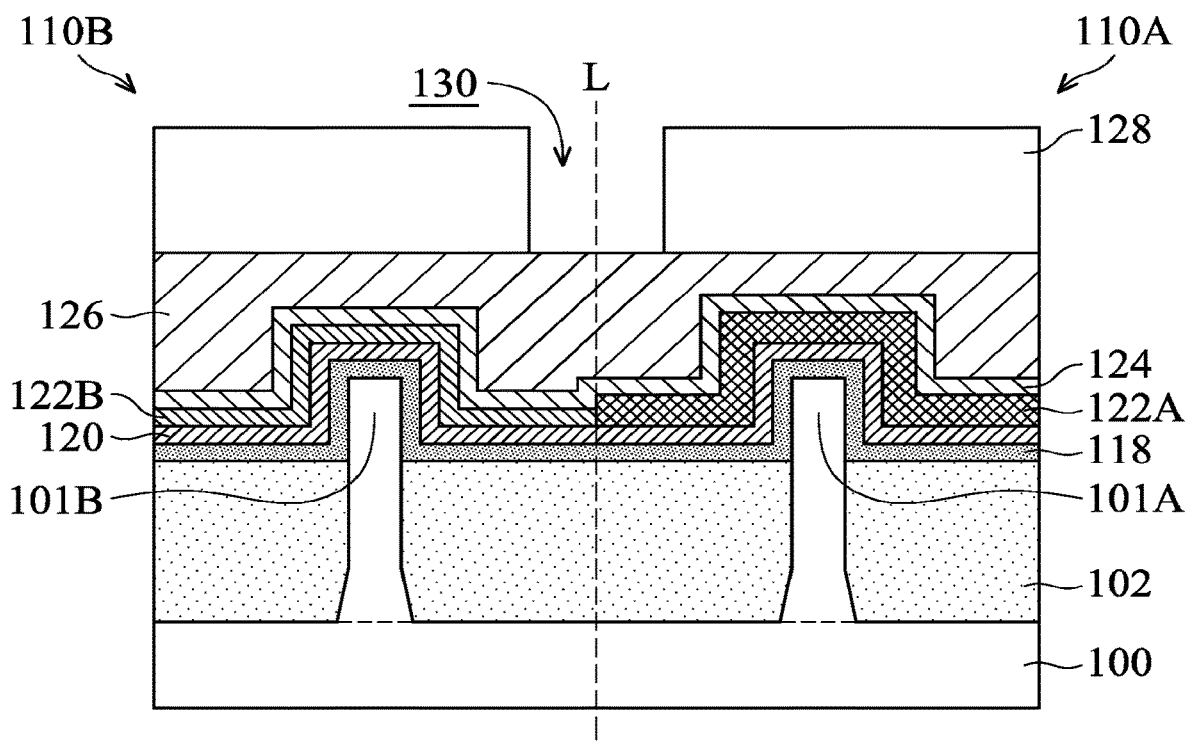

After the formation of the metal gate stack layers in the trench 116, the metal gate stack layers are patterned to form multiple metal gate stacks, in accordance with some embodiments. As shown in FIG. 1F, a mask layer 128 is deposited and patterned over the metal filling layer 126 to assist in the patterning of the metal gate stack layers, in accordance with some embodiments. In some embodiments, the mask layer 128 is made of a photoresist material, silicon nitride, silicon oxynitride, silicon oxide, titanium nitride, another suitable material, or a combination thereof. The mask layer 128 may be deposited using a spin-on process, a CVD process, another applicable process, or a combination thereof. A photolithography process and an etching process may be used to pattern the mask layer 128. In some embodiments, the mask layer 128 has an opening 130 which exposes a portion of the metal filling layer 126, as shown in FIG. 1F. The imaginary line L separating the semiconductor substrate 100 into the portions 110A and 110B may pass through the opening 130.

Figure 1G:
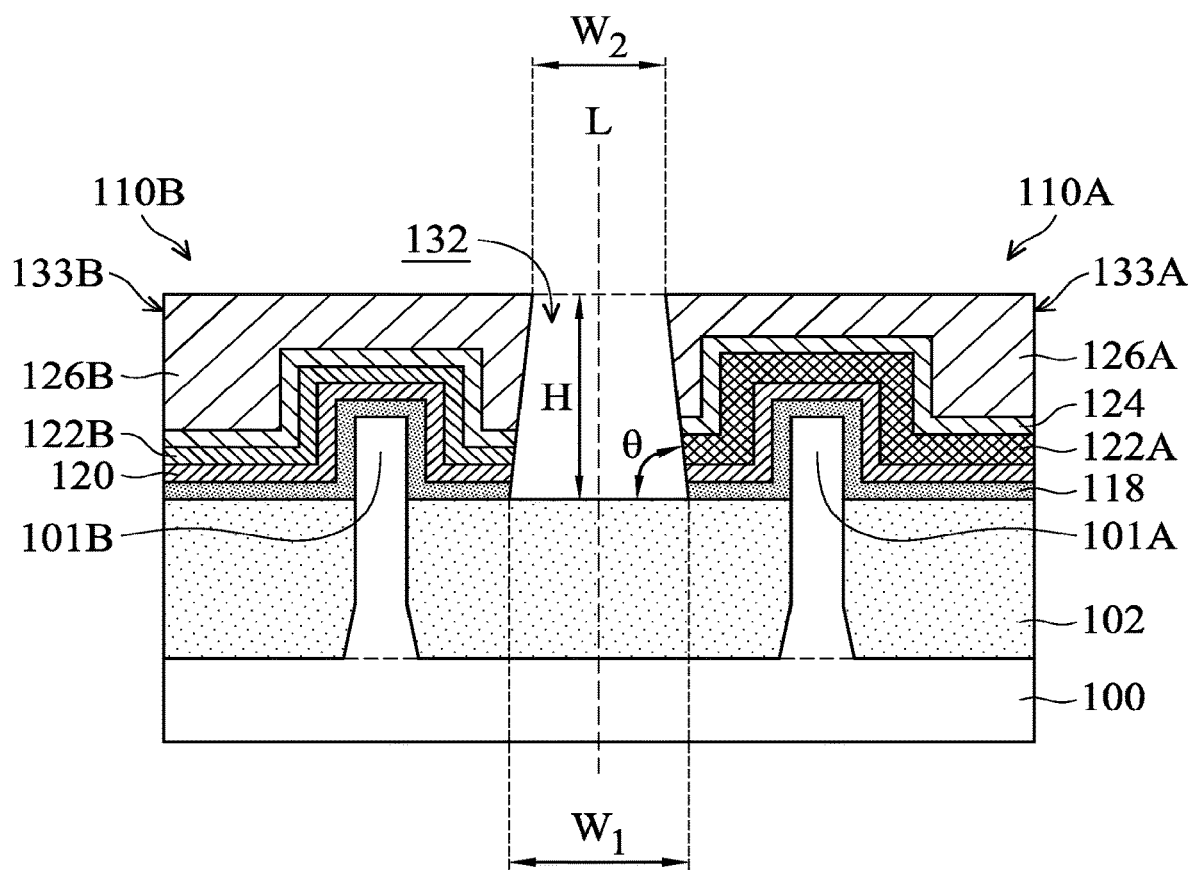

Referring to FIGS. 1G and 2F, a portion of the metal gate stack layers is removed to form one or more recesses 132 in the metal gate stack layers, in accordance with some embodiments. The mask layer 128 is used to assist in the formation of the recess 132. In some embodiments, the mask layer 128 is removed after the formation of the recess 132. The recess 132 separates the metal gate stack layers into two or more gate stacks including the gate stacks 133A and 133B, as shown in FIGS. 1G and 2F in accordance with some embodiments. In some embodiments, the gate stacks 133A and 133B are not in direct contact with each other. As shown in FIGS. 1G and 2F, the recess 132 exposes the isolation feature 102, in accordance with some embodiments.

In some embodiments, the metal filling layer 126 is divided into multiple portions including metal fillings 126A and 126B, as shown in FIGS. 1G, 2F, 3C, and 3D. In these cases, the materials of the metal fillings 126A and 126B are the same. In some other embodiments, the metal fillings 126A and 126B have different materials. In these cases, two different metal filling layers are deposited and patterned to form the metal fillings 126A and 126B. In some embodiments, the gate dielectric layers of the gate stacks 133A and 133B are portions of the gate dielectric layer 118. In these cases, the gate dielectric layers of the gate stacks 133A and 133B have the same material.

The formation of the recess 132 may also be called an end cut process. The end cut process cuts "the metal gate stack line" (or the metal gate stack layers) into multiple separate metal gate stacks. The end cut process is performed after the deposition of the metal gate stack layers. The metal gate stack layers are deposited in the trench 116 which is large enough to contain two or more gate stacks and has a relatively low aspect ratio. Therefore, the depositions of the metal gate stack layers could be performed well. The quality and the reliability of the metal gate stack layers are improved significantly. The size, the profile, and the position of the recess 132 may be controlled more precisely. As a result, problems such as short circuiting or current leakage are reduced or prevented.

As shown in FIG. 1G, the recess 132 has an upper width W2, a lower width W1, and a height H. In some embodiments, the width W1 is wider than the width W2. In some embodiments, because the width W2 is smaller than the width W1, the portions of the metal gate stack layers over the fin structures are prevented from being damaged during the formation of the recess 132. In some embodiments, the width W1 is in a range from about 15 nm to about 1000 nm. In some embodiments, the width W2 is in a range from about 10 nm to about 5 00 nm. In some embodiments, the height H is in a range from about 50 nm to about 2000 nm. However, embodiments of the disclosure are not limited thereto. In some other embodiments, the width W2 is wider than the width W1. In some embodiments, the width W1 is substantially equal to the width W2.

By varying the etching conditions for forming the recess 132, the profile of the recess 132 can be fine-tuned. For example, an angle θ between a sidewall and a bottom of the recess 132 may be tuned by varying the etching conditions. In some embodiments, the angle θ is in a range from about 10 degrees to about 85 degrees. In some other embodiments, the angle θ is in a range from about 20 degrees to about 75 degrees. In some cases, the angle θ should be greater than about 10 degrees to ensure that the width W2 is not too small to negatively affect a subsequent filing process. In some cases, the angle θ should be smaller than about 85 degrees to ensure that the portions of the metal gate stack layers over the fin structures are not damaged during the formation of the recess 132.

In some embodiments, multiple etching operations are used to form the recess 132 since the formation of the recess 132 involves etching different material layers. In some embodiments, the etchant used in the etching operations includes a gas mixture. The gas mixture may include $Cl_2$, $HBr$, $BCl_3$, $NF_3$, $N_2$, $CF_4$, $CH_2F_2$, $O_2$, $Ar$, $N_2H_2$, $CH_4$, $SF6$, another suitable gas, or a combination thereof. During the etching operations, the composition of the gas mixture may be varied according to the requirements. In some embodiments, the pressure used for performing the etching operations is in a range from about 1 mTorrs to about 80 mTorrs. In some embodiments, the operation power used for performing the etching operations is in a range from about 100 W to about 1500 W. In some embodiments, the operation temperature for performing the etching operations is in a range from about 10 degrees C. to about 50 degrees C. In some embodiments, the operation time for performing the etching operations is in a range from about 5 seconds to about 600 seconds.

Figure 1H:
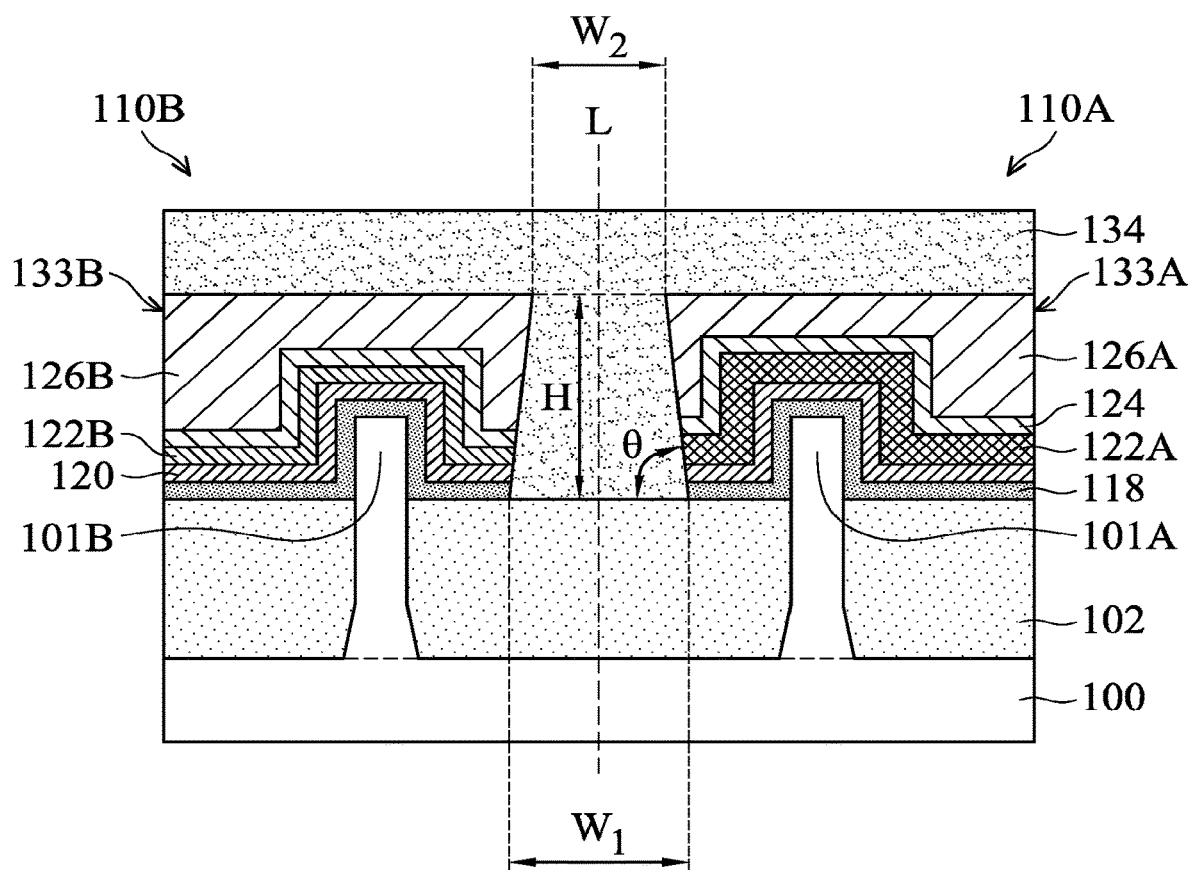

Referring to FIG. 1H, a dielectric layer 134 is formed over the gate stacks 133A and 133B (and the dielectric layer 113) to fill the recess 132, in accordance with some embodiments. In some embodiments, the dielectric layer 134 is made of silicon oxide, silicon nitride, silicon oxynitride, carbon-containing silicon oxide, another suitable dielectric material, or a combination thereof. In some embodiments, the material of the dielectric layer 134 is different from that of the dielectric layer 113 which surrounds the gate stacks 133A and 133B. However, embodiments of the disclosure are not limited thereto. In some embodiments, the materials of the dielectric layer 134 and the dielectric layer 113 are substantially the same.

In some embodiments, the dielectric layer 134 is formed using a deposition process suitable for filling a recess or an opening having a high aspect ratio or having a smaller upper width. In some embodiments, the dielectric layer 134 is deposited using an ALD process, a flowable chemical vapor deposition (FCVD) process, another applicable process, or a combination thereof. In some other embodiments, a spin-on process is used to form the dielectric layer 134.

Figure 1I:
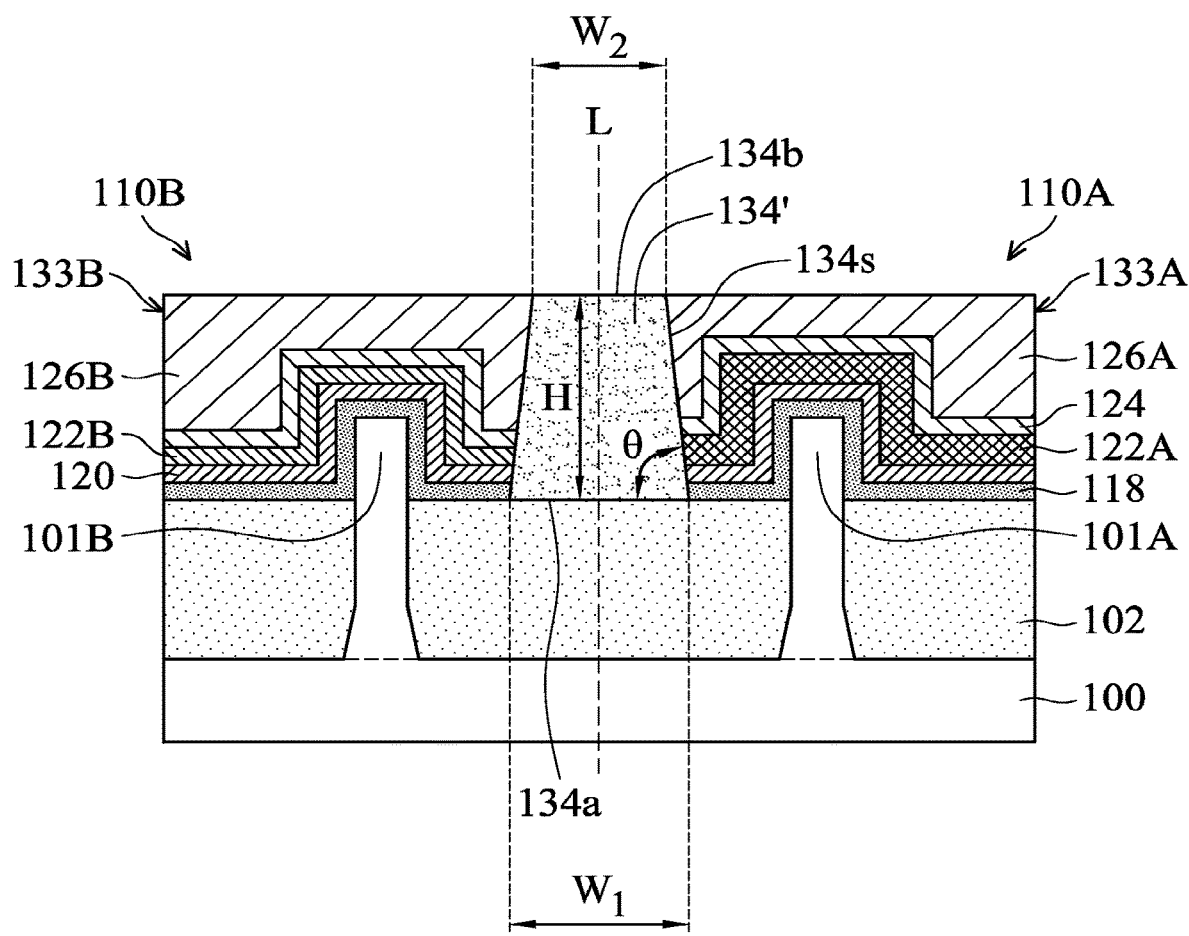

Afterwards, the portion of the dielectric layer 134 outside of the recess 132 is removed until the metal fillings 126A and 126B are exposed, as shown in FIGS. 1I and 2G. In some embodiments, a planarization process is used to partially remove the dielectric layer 134. The planarization process may include a CMP process, a grinding process, an etching process, another applicable process, or a combination thereof. As a result, the portion of the dielectric layer 134 remaining in the recess 132 forms the isolation element 134', as shown in FIGS. 1I and 2G in accordance with some embodiments.

Many variations and/or modifications can be made to embodiments of the disclosure. In some embodiments, the isolation element 134' includes a multilayer structure. For example, multiple dielectric layers are deposited to fill the recess 132. Similarly, a planarization process may be performed to remove the multiple dielectric layers outside of the recess 132. As a result, the multiple dielectric layers remaining in the recess 132 form the isolation element 134'.

As shown in FIGS. 1I and 2G, the isolation element 134' is adjacent to the gate stacks 133A and 133B, in accordance with some embodiments. In some embodiments, the isolation element 134' is in direct contact with the work function layers 122A and 122B and the metal fillings 126A and 126B of the gate stacks 133A and 133B, as shown in FIG. 1I. In some embodiments, the isolation element 134' is also in direct contact with the gate dielectric layer 118 of the gate stacks 133A and 133B. In some embodiments, the isolation element 134' is also in direct contact with the isolation feature 102, as shown in FIG. 1I.

As shown in FIG. 1I, the isolation element 134' has an upper side 134b and a lower side 134a between the upper side 134b and the semiconductor substrate 100. In some embodiments, the upper side 134b has a width equal to the width W2, and the lower side 134a has a width equal to the width W1. In some embodiments, the lower side 134a is wider than the upper side 134b. However, it should be appreciated that embodiments of the disclosure are not limited thereto. In some other embodiments, the upper side 134b is wider than the lower side 134a. In some other embodiments, the upper side 134b is substantially as wide as the lower side 134a.

As shown in FIG. 1I, the isolation element 134' has a sidewall 134s. The angle θ is between the sidewall 134s and the lower side 134a (or the bottom) of the isolation element 134'. In some embodiments, the angle θ is in a range from about 10 degrees to about 85 degrees. In some other embodiments, the angle θ is in a range from about 20 degrees to about 70 degrees.

As shown in FIGS. 1I and 2G, two transistors each including the gate stacks 133A and 133B are formed, in accordance with some embodiments. The isolation element 134' is formed in between ends of the gate stacks 133A and 133B to electrically isolate the gate stack 133A from the gate stack 133B. The gate dielectric layer and the work function layer are in direct contact with lower portions of the isolation element 134', and the metal filling is in direct contact with an upper portion of the isolation element 134'. Because each of the gate stacks is formed by patterning the metal gate stack layers, the height of the gate stack may be well controlled. In some embodiments, no planarization needs to be performed to ensure that different gate stacks have the same height. Therefore, the associated processing cost and processing time are reduced. The residues generated during the planarization process are also reduced.

Embodiments of the disclosure form a semiconductor device structure with one or more metal gate stacks and fin structures. A dummy gate stack line is removed to form a trench where more than two metal gate stacks will be formed. Metal gate stack layers are formed to fill the trench. Afterwards, one or more recesses are formed in the metal gate stack layers to separate the metal gate stack layers into two or more metal gate stacks. One or more isolation elements are formed afterwards in the recesses to electrically isolate the metal gate stacks. Since the metal gate stack layers are deposited in the trench which is large enough to contain two or more gate stacks, the deposition of the metal gate stack layers can be performed well. The quality and the reliability of the metal gate stack layers are improved significantly.

In accordance with some embodiments, a semiconductor device structure is provided. The semiconductor device structure includes a fin structure over a semiconductor substrate. The semiconductor device structure also includes a gate stack covering a portion of the fin structure, and the gate stack includes a work function layer and a metal filling over the work function layer. The semiconductor device structure further includes an isolation element over the semiconductor substrate and adjacent to the gate stack. The isolation element is in direct contact with the work function layer and the metal filling.

In accordance with some embodiments, a semiconductor device structure is provided. The semiconductor device structure includes semiconductor device structure. The semiconductor device structure also includes a first gate stack covering a portion of the first fin structure and a second gate stack covering a portion of the second fin structure. The semiconductor device structure further includes an isolation element over the semiconductor substrate and between the first gate stack and the second gate stack. The isolation element is in direct contact with a first work function layer and a first metal filling of the first gate stack and a second work function layer and a second metal filling of the second gate stack.

In accordance with some embodiments, a method for forming a semiconductor device structure is provided. The method includes forming a first fin structure and a second fin structure over a semiconductor substrate. The method also includes forming a dummy gate stack over the semiconductor substrate to partially cover the first fin structure and the second fin structure. The method further includes removing the dummy gate stack to form a trench over the semiconductor substrate and forming metal gate stack layers in the trench. In addition, the method includes forming at least one recess in the metal gate stack layers to separate the metal gate stack layers into at least two gate stacks and forming an isolation element in the at least one recess.

One general aspect of embodiments disclose herein includes a semiconductor device structure. The semiconductor device structure includes a fin structure over a semiconductor substrate. The semiconductor device structure also includes a gate stack covering a portion of the fin structure, where the gate stack includes a work function layer and a metal filling over the work function layer. The semiconductor device structure also includes an isolation element over the semiconductor substrate and adjacent to the gate stack, where the isolation element has a trapezoidal shape when viewed in cross section, the trapezoidal shape being wider at the bottom, nearer the substrate, relative to the top.

Another general aspect of embodiments disclose herein includes a semiconductor device structure. The semiconductor device structure includes a first fin structure over a semiconductor substrate and having an n-type transistor formed therein. The semiconductor device structure also includes a second fin structure over the semiconductor substrate and having an p-type transistor formed therein, where the second fin structure has a longitudinal axis that is parallel to and offset from a longitudinal axis of the first fin structure. The semiconductor device structure also includes a first gate stack covering a portion of the first fin structure, the first gate stack including a first work function layer and a first metal filling over the first work function layer. The semiconductor device structure also includes a second gate stack covering a portion of the second fin structure, the second gate stack including a second work function layer having a different work function value than the first work function layer, the second gate stack further including a second metal filling over the second work function layer, where the second gate stack has a longitudinal axis that is parallel to and aligned with a longitudinal axis of the first gate stack. The semiconductor device structure also includes an isolation element between the first gate stack and the second gate stack, a first interface between the isolation element and the first gate stack tilting away from the first gate stack as the interface extends away from the substrate, and a second interface between the isolation element and the second gate stack extending toward the second gate stack as the interface extends away from the substrate.

Still another general aspect of embodiments disclose herein includes a device including a first transistor region and a second transistor region in a substrate. The device also includes a first gate stack over the first transistor region and a second gate stack over the second transistor region, where the first gate stack has a first sidewall facing a second sidewall of the second gate stack, and where the first sidewall slopes away from the second sidewall when going from a topmost surface of the first sidewall to a bottommost surface of the first sidewall, the topmost surface of the first sidewall being the surface farthest from the substrate, and further where the second sidewall slopes away from the first sidewall when going from a topmost surface of the second sidewall to a bottommost surface of the second sidewall, the topmost surface of the second sidewall being the surface farthest from the substrate.

Other embodiments disclosed herein include a semiconductor device including: a first fin element having a longitudinal axis extending in a first direction; a first gate stack extending over the first fin element and having a longitudinal axis extending in a second direction perpendicular to the first direction, the first gate stack having a first end and a second end separated along the second direction; a second fin element having a longitudinal axis extending in the first direction; a second gate stack extending over the second fin element, the second gate stack extending in the second direction and having a first end and a second end separated along the second direction; and an isolation element between the first end of the first gate stack and the first end of the second gate stack, where the isolation element contacts the first end of the first gate stack and further contacts the first end of the second gate stack.

Yet other embodiments disclosed herein include a semiconductor device, including: a first fin element having a longitudinal axis extending in a first direction and having a first end and a second end separated along the first direction; a second fin element having a longitudinal axis extending in the first direction and having a first end and a second end separated along the first direction; a gate electrode material extending in a second direction perpendicular to the first direction and extending over the first fin element and the second fin element; and where the gate electrode material is divided by an isolation element into at least a first portion and a second portion, the isolation element extending from a topmost surface of the gate electrode material to a topmost surface of an isolation layer, the isolation layer at least partially surrounding a lower portion of the first fin element and a lower portion of the second fin element.

Yet other embodiments disclosed herein include a semiconductor device including: a substrate having extending therefrom a first fin and a second fin; a p-type transistor formed in the first fin, the p-type transistor including a first metal gate electrode, the first metal gate electrode having an end terminating at a first sidewall of an isolation element; an n-type transistor formed in the second fin adjacent the first fin, the n-type transistor including a second metal gate electrode, the second metal gate electrode having an end terminating at a second sidewall of the isolation element, opposite the first sidewall; and where the first sidewall forms an acute angle θ relative to a major surface of the substrate and the second sidewall forms an acute angle θ r relative to the major surface of the substrate.

Other general aspects described herein are a method of forming a dummy gate structure extending over multiple transistor regions. The method also includes removing the dummy gate structure to form a trench structure extending over the multiple transistor regions. The method also includes filling the trench with a gate structure, the gate structure extending over the multiple transistor regions. The method also includes patterning the gate structure to form a recess in the gate structure before a first and a second of the multiple transistor regions, where the width of the recess, in a direction between the first and second of the multiple transistor regions, is wider at the top of the recess than the width of the recess at the bottom of the recess.

Still other general aspect includes disclosed herein include a method of forming a first transistor region and a second transistor region in a substrate. The method also includes forming a dummy gate stack extending over the first transistor region and a second fin transistor region. The method also includes removing the dummy gate stack to form a trench extending over the first transistor region and a second fin transistor region. The method also includes filling the trench with gate layers. The method also includes patterning the gate layers to form a gap separating a first gate structure over the first transistor region and a second gate structure over the second transistor region, where the first gate structure has a first sidewall facing a second sidewall of the second gate structure, and where the first sidewall slopes away from the second sidewall when going from a topmost surface of the first sidewall to a bottommost surface of the first sidewall, the topmost surface of the first sidewall being the surface farthest from the substrate, and further where the second sidewall slopes away from the first sidewall when going from a topmost surface of the second sidewall to a bottommost surface of the second sidewall, the topmost surface of the second sidewall being the surface farthest from the substrate.

Yet other general aspect disclosed herein includes a device including a first transistor region and a second transistor region in a substrate. The device also includes a first gate structure over the first transistor region and a second gate structure over the second transistor region, where the first gate structure has a first sidewall facing a second sidewall of the second gate structure, and where the first sidewall slopes away from the second sidewall when going from a topmost surface of the first sidewall to a bottommost surface of the first sidewall, the topmost surface of the first sidewall being the surface farthest from the substrate, and further where the second sidewall slopes away from the first sidewall when going from a topmost surface of the second sidewall to a bottommost surface of the second sidewall, the topmost surface of the second sidewall being the surface farthest from the substrate.

Those of skill in the applicable arts will appreciate that this disclosure elucidates, among other concepts, principles, and embodiments, a method for forming a semiconductor device structure, the method including depositing a dielectric layer over a first transistor structure and a second transistor structure. The method also includes forming a dummy gate stack extending over the first transistor structure and the second transistor structure. The method further includes removing the dummy gate stack to form a trench between the first transistor structure and the second transistor structure, the trench extending over a semiconductor substrate. The method yet further includes forming metal gate stack layers in the trench, forming at least one recess in the metal gate stack layers to separate the metal gate stack layers into at least two gate stacks, where the recess has an upper width and a lower width, and the lower width is greater than the upper width, and depositing an isolation element in the at least one recess.

Those of skill in the applicable arts will appreciate further that this disclosure elucidates, among other concepts, principles, and embodiments a method including forming a fin structure over a semiconductor substrate, and covering a portion of the fin structure with a gate stack, where the gate stack may include a work function layer and a metal filling over the work function layer. The method also includes forming an isolation element dividing the gate stack into two regions, where the isolation element has a trapezoidal shape when viewed in cross section, the trapezoidal shape being wider at the bottom, nearer the semiconductor substrate, relative to the top.

Those of skill in the applicable arts will appreciate also that this disclosure elucidates, among other concepts, principles, and embodiments a method that includes forming a first transistor region in a first fin structure extending from a substrate and a second transistor region in a second fin structure extending from the substrate. The method also includes forming a gate stack extending over the first transistor region and the second transistor region. The method also includes patterning the gate stack to have an opening extending therethrough, the opening having a first sidewall facing the first transistor region and a second sidewall facing the second transistor region, where the first sidewall slopes toward from the first transistor region when going from a topmost surface of the first sidewall to a bottommost surface of the first sidewall, the topmost surface of the first sidewall being the surface farthest from the substrate, and further where the second sidewall slopes toward the second transistor region when going from a topmost surface of the second sidewall to a bottommost surface of the second sidewall, the topmost surface of the second sidewall being the surface farthest from the substrate. The method yet further includes filling the opening with an isolation structure extending from the first sidewall to the second sidewall.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:

depositing a dielectric layer over a first transistor structure and a second transistor structure;

forming a dummy gate stack extending over the first transistor structure and the second transistor structure;

removing the dummy gate stack to form a trench between the first transistor structure and the second transistor structure, the trench extending over a semiconductor substrate;

forming metal gate stack layers in the trench;

forming at least one recess in the metal gate stack layers to separate the metal gate stack layers into at least two gate stacks, wherein the recess has an upper width and a lower width, and the lower width is greater than the upper width; and depositing an isolation element in the at least one recess.

2. The method of claim 1, further comprising:

forming a first fin structure for the first transistor structure; and forming a second fin structure for the second transistor structure.

3. The method of claim 1, wherein the step of depositing a dielectric layer includes depositing multiple dielectric layers including at least one liner layer.

4. The method of claim 1, further comprising:

depositing a second dielectric layer over the dummy gate stack before removing the dummy gate stack; and thinning the second dielectric layer to expose a top surface of the dummy gate stack.

5. The method of claim 1, further comprising forming dummy gate spacers on respective sidewalls of the dummy gate stack, and wherein the dummy gate spacers remain extant after removing the dummy gate stack.

6. The method of claim 1, wherein the step of forming metal gate stack layers in the trench includes:

forming an n-type metal gate stack in the first transistor structure; and forming a p-type metal gate stack in the second transistor structure.

7. The method of claim 6, wherein the n-type metal gate stack includes at least one layer also included in the p-type metal gate stack and further includes at least one layer not included in the p-type metal gate stack.

8. A method comprising:

forming a fin structure over a semiconductor substrate;

covering a portion of the fin structure with a gate stack, wherein the gate stack comprises a work function layer and a metal filling over the work function layer; and forming an isolation element dividing the gate stack into two regions, wherein the isolation element has a trapezoidal shape when viewed in cross section, the trapezoidal shape being wider at the bottom, nearer the semiconductor substrate, relative to the top.

9. The method of claim 8, further comprising covering a portion of a second fin structure with the gate stack.

10. The method of claim 9, wherein the gate stack further comprises a second work function layer where it covers the portion of the second fin structure.

11. The method of claim 8, wherein the step of forming an isolation element dividing the gate stack into two regions includes:

forming a dummy gate stack over the fin structure;

partially covering the fin structure and the dummy gate stack with a dielectric layer;

removing the dummy gate stack for form a trench in the dielectric layer;

filling the trench with metal layers;

etching into the metal layers to form an opening therein; and filling the opening with the isolation element.

12. The method of claim 8, wherein the step of forming an isolation element 134' dividing the gate stack into two regions includes performing an etching process on the gate stack to form a recess into the gate stack and varying the etching conditions during the etching process.

13. The method of claim 12, wherein varying the etching conditions includes varying the composition of etchant gas mixture during the etching process.

14. The method of claim 11, wherein the step of filling the opening with the isolation element includes depositing into the opening a material selected from the group consisting of silicon oxide, silicon nitride, silicon oxynitride, carbon-containing silicon oxide, and combinations thereof.

15. A method comprising:

forming a first transistor region in a first fin structure extending from a substrate and a second transistor region in a second fin structure extending from the substrate;

forming a gate stack extending over the first transistor region and the second transistor region;

patterning the gate stack to have an opening extending therethrough, the opening having a first sidewall facing the first transistor region and a second sidewall facing the second transistor region, wherein the first sidewall slopes toward from the first transistor region when going from a topmost surface of the first sidewall to a bottommost surface of the first sidewall, the topmost surface of the first sidewall being the surface farthest from the substrate, and further wherein the second sidewall slopes toward the second transistor region when going from a topmost surface of the second sidewall to a bottommost surface of the second sidewall, the topmost surface of the second sidewall being the surface farthest from the substrate; and filling the opening with an isolation structure extending from the first sidewall to the second sidewall.

16. The method of claim 15 further including:

forming a dummy gate structure extending over the first transistor region and the second transistor region;

forming sidewall spacers on respective sides of the dummy gate structure;

removing the dummy gate structure, while leaving the sidewall spacers intact; and depositing the gate stack in a space left from removing the dummy gate structure.

17. The method of claim 15, wherein the step of patterning the gate stack to have an opening 132 extending therethrough includes etching through metal layers of the gate stack using an etching process while varying etching process conditions.

18. The method of claim 17, further comprising varying etching process conditions to cause the opening to have an angle of sidewall slope of from about 10 degrees to about 85 degrees.

19. The method of claim 15, wherein the step of forming a gate stack extending over the first transistor region and the second transistor region includes depositing a first stack of metal layers over the first transistor region and depositing a second stack of metal layers over the second transistor region.

20. The method of claim 19, further comprising depositing at least one metal layer of the first stack of metal layers simultaneously with a metal layer of the second stack of metal layers.

* * * * *